(12) United States Patent
Lee et al.

(10) Patent No.: US 7,504,295 B2
(45) Date of Patent: Mar. 17, 2009

(54) METHODS FOR FABRICATING DYNAMIC RANDOM ACCESS MEMORY CELLS HAVING LATERALLY OFFSET STORAGE NODES

(75) Inventors: Sang-hyeon Lee, Gyeonggi-do (KR); Dong-il Bae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 219 days.

(21) Appl. No.: 11/470,011

(22) Filed: Sep. 5, 2006

(65) Prior Publication Data

US 2007/0026603 A1 Feb. 1, 2007

Related U.S. Application Data

(62) Division of application No. 10/425,231, filed on Apr. 29, 2003, now Pat. No. 7,119,389.

(30) Foreign Application Priority Data

Jul. 8, 2002 (KR) .......................... 2002-0039386

(51) Int. Cl.
*H01L 21/8238* (2006.01)
*H01L 21/8234* (2006.01)
*H01L 21/8244* (2006.01)

(52) U.S. Cl. ............... 438/232; 438/238; 257/E21.646; 257/E21.647

(58) Field of Classification Search ............... 438/232, 438/238, 592, 558, 688, 689; 257/E21.646, 257/E21.647, E21.648
See application file for complete search history.

(56) References Cited

U.S. PATENT DOCUMENTS 5,442,212 A 8/1995 Eimori

| | | |
|---|---|---|
| 5,496,757 A | 3/1996 | Rosner |
| 5,811,316 A | 9/1998 | Sugiura et al. |
| 5,811,849 A | 9/1998 | Matsuura |
| 6,143,602 A | 11/2000 | Jang |

(Continued)

FOREIGN PATENT DOCUMENTS

DE 42 22 467 C1 6/1993

(Continued)

OTHER PUBLICATIONS

Notice to File a Response/Amendment to the Examination Report, KR Patent Application No. 2003-0039386, Aug. 31, 2004.

(Continued)

*Primary Examiner*—Walter L Lindsay, Jr.
(74) *Attorney, Agent, or Firm*—Myers Bigel Sibley & Sajovec, P.A.

(57) ABSTRACT

DRAM cells include a common drain region in an integrated circuit substrate and first and second source regions in the integrated circuit substrate, a respective one of which is laterally offset from the common drain region along respective first and second opposite directions. First and second storage nodes are provided on the integrated circuit substrate, a respective one of which is electrically connected to a respective one of the first and second source regions. The first and second storage nodes are laterally offset from the respective first and second source regions along the first direction.

22 Claims, 9 Drawing Sheets

U.S. PATENT DOCUMENTS

| | | |
|---|---|---|
| 6,287,971 B1 * | 9/2001 | Park et al. .................. 438/689 |
| 6,562,651 B2 * | 5/2003 | Chung et al. .................. 438/98 |
| 6,852,611 B2 | 2/2005 | Wald et al. |
| 2001/0019893 A1 | 9/2001 | Prall et al. |
| 2002/0122284 A1 | 9/2002 | Yang et al. |
| 2003/0139027 A1 | 7/2003 | Ikeda et al. |
| 2004/0046195 A1 | 3/2004 | Nakamura et al. |

FOREIGN PATENT DOCUMENTS

| | | |
|---|---|---|
| DE | 199 08 446 A1 | 11/1999 |
| GB | 2 336 716 A | 10/1999 |
| JP | 10-84091 A | 3/1998 |
| JP | 2000-150824 A | 5/2000 |
| JP | 2000-349250 A | 12/2000 |
| KR | 0162516 B1 | 12/1998 |

OTHER PUBLICATIONS

Translation of an Official Letter as issued by the German Patent and Trademark Office, Official File No. 10330072.4-33, Dec. 1, 2004.

* cited by examiner

METHODS FOR FABRICATING DYNAMIC RANDOM ACCESS MEMORY CELLS HAVING LATERALLY OFFSET STORAGE NODES

RELATED APPLICATIONS

This application is a divisional of application Ser. No. 10/425,231, filed Apr. 29, 2003, entitled Dynamic Random Access Memory Cells Having Laterally Offset Storage Nodes, now U.S. Pat. No. 7,119,389, and claims the benefit of Korean Patent Application No. 2002-0039386, filed Jul. 8, 2002, the disclosures of both of which are hereby incorporated herein by reference in their entirety as if set forth fully herein.

FIELD OF THE INVENTION

The present invention relates to semiconductor memory devices, and more particularly to memory cells of Dynamic Random Access Memory (DRAM) devices.

BACKGROUND OF THE INVENTION

Integrated circuit memory devices are widely used for consumer, commercial and industrial applications. As is well known to those having skill in the art, integrated circuit memory devices may be divided into Dynamic Random Access Memory (DRAM) devices and Static Random Access Memory (SRAM) devices. DRAM devices require refresh to prevent the data that is stored therein from being lost. SRAM devices, on the other hand, do not require refresh. As is well known to those having skill in the art, a DRAM memory cell may include a transistor, such as a field effect transistor, often referred to as a Metal Oxide Semiconductor (MOS) transistor, and a capacitor.

As is also well known to those having skill in the art, a DRAM device includes a cell array region and a peripheral circuit region, The cell array region has a plurality of active regions, which are two dimensionally arrayed along rows and columns, and a pair of word lines crossing over the respective active regions. Also, first and second source regions are formed at respective opposite ends of the respective active regions, and common (shared) drain regions are formed at the active regions between the pair of word lines. Therefore, a pair of access transistors are disposed in each of the respective active regions.

In addition, first and second cell capacitors are formed over the first and second source regions, respectively. The respective first and second cell capacitors are electrically connected to the respective first and second source regions. As a result, a pair of cells is formed at each of the active regions. Each of the cell capacitors comprises a lower or storage node electrically connected to the first or second source region, a dielectric layer stacked on the storage node, and an upper or plate electrode stacked on the dielectric layer.

In a conventional DRAM cell, the storage node has an oval shape or a rectangular shape when viewed from a top plan view. In other words, the storage node has a width, which is less than a length thereof. The width of the storage node is typically equal to a half of the length thereof. Thus, in the event that the height of the storage nodes is increased in order to increase the capacity of the cell capacitors, the storage nodes may lean toward a width direction thereof. In particular, when the substrate having the storage nodes is rotated to remove cleaning solution or deionized water from the substrate, the storage nodes may lean toward a width direction thereof. Accordingly, the adjacent storage nodes may electrically connect to each other, thereby generating two-bit fail.

A DRAM device having rectangular polygon-shaped storage nodes or circle-shaped storage nodes is taught in the Japanese laid-open patent number 2000-150824. The semiconductor device comprises a plurality of active regions, which are two dimensionally arrayed along rows and columns. The active regions include first through fourth active regions. The first active regions are disposed to have a first pitch and a second pitch along x-axis and y-axis, respectively. Here, the x-axis and the y-axis are parallel with the rows and the columns respectively. The second active regions are arrayed at positions relative to the first active regions that are parallel-shifted by a quarter of the first pitch and a quarter of the second pitch along the x-axis and the y-axis respectively, and the third active regions are arrayed at positions relative to the first active regions that are parallel-shifted by a half of the first pitch and a half of the second pitch along the x-axis and the y-axis, respectively. Similarly, the fourth active regions are arrayed at positions relative to the first active regions that are parallel-shifted by three quarters of the first pitch and three quarters of the second pitch alone the x-axis and the y-axis, respectively. Also, a first source region is formed at one end of the active regions and a second source region is formed at another end of the active regions. Storage nodes are formed over the first and second source regions.

According to the Japanese laid-open patent number 2000-150824, it may be difficult to increase an alignment margin during formation of the storage nodes, since a space between a bit line pad and a storage node contact hole adjacent to the bit line pad may be less than a minimum design rule. In addition, it may be desirable to increase channel widths and channel lengths of access MOS transistors in order to improve characteristics of the access MOS transistors formed at the active regions. In other words, there may be a need to increase widths of word lines that overlap with the active regions and widths of the active regions that overlap with the word lines. However, according to the layout of the active regions disclosed in the Japanese laid-open patent No. 2000-150824, it may not be easy to increase the widths of the word lines that overlap with the active regions and the widths of the active regions that overlap with the word lines.

SUMMARY OF THE INVENTION

According to some embodiments of the present invention, a DRAM cell array region comprises an isolation layer in a predetermined region of a semiconductor substrate to define an active region. A pair of access transistors (i.e., a first MOS transistor and a second MOS transistor) are located in the active region. The first MOS transistor includes a first impurity region at one end of the active region, and the second MOS transistor includes a second impurity region at another end of the active region. The first impurity region acts as a source region of the first MOS transistor, and the second impurity region acts as a source region of the second MOS transistor. A first storage node and a second storage node are disposed on the substrate including the first and second MOS transistors. The first storage node is electrically connected to the first impurity region, and the second storage node is electrically connected to the second impurity region. Central axes of the first and second storage nodes pass through a first position and a second position that are spaced apart from central points of the first and second impurity regions, respectively, by predetermined distances toward a single direction. The single direction is parallel with the length direction of the active region.

In other embodiments, the first and second MOS transistors comprise a pair of word lines (i.e., a pair of gate electrodes) that cross over the active region. The gate electrodes are extended to cross over the isolation layer. In other embodiments, the widths of the gate electrodes on the active region are greater than the widths of the gate electrodes on the isolation layer. Also, in other embodiments, the width of the active region that overlaps with the gate electrodes is greater than the widths of the source regions.

In some embodiments, a first contact plug and a second contact plug may be disposed on the first and second impurity regions, respectively. The central axes of the first and second contact plugs pass through the central points of the first and second impurity regions, respectively. In some embodiments, a first storage node pad is interposed between the first contact plug and the first storage node. Similarly, in some embodiments, a second storage node pad is interposed between the second contact plug and the second storage node. In some embodiments, a central axis of the first storage node pad is located at the position between the central axis of the first contact plug and the central axis of the first storage node. Also, a central axis of the second storage node pad is located at the position between the central axis of the second contact plug and the central axis of the second storage node.

In some embodiments, the predetermined distances are less than the distance between the central point of the active region and the central point of the first or second impurity region. In other embodiments, the central axis of the first storage node passes through the isolation layer that is adjacent to the first impurity region and is located opposite the second MOS transistor, and the central axis of the second storage node passes through a channel region of the second MOS transistor.

In some embodiments, the first and second storage nodes have a regular polygon shape (i.e., equal sides and angles) or a circular shape when viewed from a top plan view. In addition, the first and second storage nodes may have a cylindrical shape or a box shape when viewed from a perspective view.

According to other embodiments of the invention, the DRAM cell array region comprises a plurality of active regions, which are two dimensionally arrayed alone rows and columns. The active regions include first active regions and second active regions. The active regions are defined by an isolation layer. The first active regions are arrayed to have a first pitch and a second pitch along an x-axis and y-axis, respectively. The x-axis is parallel with the rows and the y-axis is parallel with the columns. Also, the second active regions are disposed at positions such that the first active regions are parallel-shifted by a half of the first pitch and a half of the second pitch along the x-axis and the y-axis, respectively.

A first MOS transistor and a second MOS transistor are located in each of the first active regions. The first and second MOS transistors are disposed so that the first and second MOS transistors are serially connected to each other. Similarly, a third MOS transistor and a fourth MOS transistor are located in each of the second active regions. The third and fourth MOS transistors are also serially connected to each other. First storage nodes through fourth storage nodes are disposed on the substrate having the first through fourth MOS transistors. The first and second MOS transistors comprise first impurity regions and second impurity regions, which are located at opposite ends of the first active regions to act as source regions of the first and second MOS transistors, respectively. Similarly, the third and fourth MOS transistors comprise third impurity regions and fourth impurity regions, which are located at opposite ends of the second active regions to act as source regions of the third and fourth MOS transistors, respectively. The first through fourth storage nodes are electrically connected to the first through fourth impurity regions, respectively. Central axes of the first and second storage nodes pass through first positions and second positions that are spaced apart from central points of the first and second impurity regions by predetermined distances toward a negative direction of the x-axis, respectively. In contrast, central axes of the third and fourth storage nodes pass through third positions and fourth positions that are spaced apart from central points of the third and fourth impurity regions by predetermined distances toward a positive direction of the x-axis, respectively.

In some embodiments, the first and second MOS transistors comprise first and second parallel gate electrodes that cross over the first active regions, and the third and fourth MOS transistors comprise third and fourth parallel gate electrodes that cross over the second active regions. In some embodiments, widths of the gate electrodes on the first and second active regions are greater than widths of the gate electrodes on the isolation layer. In addition, in other embodiments, widths of the active regions overlapped with the gate electrodes are greater than widths of the source regions.

In some embodiments, a first contact plug through a fourth contact plug may be disposed on the first through fourth impurity regions, respectively. Central axes of the first through fourth contact plugs pass through central points of the first through fourth impurity regions, respectively. Further, in some embodiments, first storage node pads may be interposed between the first contact plugs and the first storage nodes, and second storage node pads may be interposed between the second contact plugs and the second storage nodes. Similarly, in other embodiments, third storage node pads may be interposed between the third contact plugs and the third storage nodes, and fourth storage node pads may be interposed between the fourth contact plugs and the fourth storage nodes.

In some embodiments, the central axis of the first storage node pad passes through a region between the central axis of the first impurity region and the central axis of the first storage node electrically connected to the first impurity region, and the central axis of the second storage node pad passes through a region between the central axis of the second impurity region and the central axis of the second storage node electrically connected to the second impurity region. Also, the central axis of the third storage node pad passes through a region between the central axis of the third impurity region and the central axis of the third storage node electrically connected to the third impurity region, and the central axis of the fourth storage node pad passes through a region between the central axis of the fourth impurity region and the central axis of the fourth storage node electrically connected to the fourth impurity region.

In other embodiments, the predetermined distance is less than a distance between the central point of the active region and the central point of the first, second, third or fourth impurity region (source region) in the active region. In other embodiments, the central axis of the first storage node passes through the isolation layer which is adjacent to the first impurity region and is located opposite the second MOS transistor, and the central axis of the second storage node passes through the channel region of the second MOS transistor. Also, in other embodiments, the central axis of the third storage node passes through the channel region of the third MOS transistor, and the central axis of the fourth storage node passes through the isolation layer which is adjacent to the fourth impurity region and is located opposite the third MOS transistor.

In some embodiments of the invention, the first pitch is equal to twice the second pitch. In other embodiments, the first through fourth storage nodes exhibit a regular polygon shape or a circular shape when viewed from a top plan view. Also. the first through fourth storage nodes may have a cylindrical shape or a box shape when viewed from a perspective view.

DRAM cells according to other embodiments of the present invention include a common drain region in an integrated circuit substrate and first and second source regions in the integrated circuit substrate, a respective one of which is laterally offset from the common drain region along respective first and second opposite directions. First and second storage nodes are provided on the integrated circuit substrate, a respective one of which is electrically connected to a respective one of the first and second source regions. The first and second storage nodes are laterally offset from the respective first and second source regions along the first direction.

In other embodiments, first and second gate electrodes also are provided, a respective one of which is on the integrated circuit substrate between the common drain region and a respective one of the first and second source regions. Third and fourth gate electrodes also are provided, a respective one of which is on the integrated circuit substrate adjacent a respective one of the first and second source regions and remote from the common drain region. The third and fourth gate electrodes are narrower than the first and second gate electrodes adjacent the first and second source regions.

In still other embodiments, first and second contact plugs are provided on the integrated circuit substrate, a respective one of which electrically connects to a respective one of the first and second source regions. The first and second contact plugs are laterally aligned with the respective first and second source regions.

In still other embodiments, first and second storage node pads also are provided on the integrated circuit substrate, a respective one of which is located between a respective one of the first and second contact plugs and a respective one of the first and second storage nodes. The first and second storage node pads are laterally offset from the respective first and second source regions along the first direction. In some embodiments, the first and second storage nodes are also laterally offset from the respective first and second storage node pads along the first direction.

In still other embodiments, the first and second storage nodes are laterally offset from the respective first and second source regions along the first direction by less than a distance between a central point of the first source region and a central part of the common drain region. In still other embodiments, a central point of the first storage node lies between the first source region and the common drain region and, in yet other embodiments, the first and second storage nodes exhibit a regular polygon shape or a circular shape in plan view.

In still other embodiments of the present invention, a DRAM includes a plurality of equally spaced apart alternating rows of first and second active regions in an integrated circuit substrate. The second active regions are laterally offset from the first active regions such that a respective second active region is equally spaced apart from two closest first active regions in an adjacent row. Each of the first active regions includes first and second source regions and a common first drain region therebetween. A respective one of the first and second source regions is laterally offset from the common drain region along respective first and second opposite directions. Each of the second active regions comprises third and fourth source regions and a second common drain region therebetween. A respective third and fourth source region is laterally offset from the second common drain region along the respective first and second opposite directions.

An array of first and second storage nodes also are provided on the, integrated circuit substrate, a respective one of which is electrically connected to a respective one of the first and second source regions. The respective first and second storage nodes are laterally offset from the respective first and second source regions along the first direction. An array of third and fourth storage nodes also are provided on the integrated circuit substrate, a respective one of which is electrically connected to a respective one of the third and fourth source regions. The respective third and fourth storage nodes are laterally offset from the respective third and fourth source regions along the second direction. Narrow and wide gate electrodes, contact plugs, storage pads and/or storage nodes may be provided as was described above in connection with other embodiments of the present invention.

Still other embodiments of DRAMs according to the present invention include an array of memory cell transistors in an integrated circuit substrate, each of which comprises a source region. An array of storage nodes is provided on the integrated circuit substrate that are of regular polygonal or circular shape in plan view, a respective one of which is electrically connected to a respective one of the source regions and laterally offset therefrom. An array of contact plugs, an array of storage node pads and/or other aspects of the above-described embodiments also may be provided.

According to other embodiments of the invention, fabrication methods of a DRAM cell array region comprise forming an isolation layer at a predetermined region of a semiconductor substrate to define a plurality of active regions. The active regions include first active regions and second active regions, which are two-dimensionally arrayed along rows and columns. The first active regions are defined to have a first pitch and a second pitch along x-axis and y-axis respectively, and the second active regions are defined at positions such that the first active regions are parallel-shifted along the x-axis and the y-axis by a half of the first pitch and a half of the second pitch respectively. The x-axis and the y-axis are parallel with the rows and the columns respectively.

A first MOS transistor and a second MOS transistor are formed at each of the first active regions, and a third MOS transistor and a fourth MOS transistor are simultaneously formed at each of the second active regions. The first and second MOS transistors are formed so that the first and second MOS transistors are serially connected to each other. Also, the third and fourth MOS transistors are formed so that the third and fourth MOS transistors are serially connected to each other. First impurity regions and second impurity regions are formed at opposite ends of the first active regions, respectively. The first impurity regions act as source regions of the first MOS transistors, and the second impurity regions act as source regions of the second MOS transistors. Similarly, third impurity regions and fourth impurity regions are formed at opposite ends of the second active regions, respectively, The third impurity regions act as source regions of the third MOS transistors, and the fourth impurity regions act as source regions of the fourth MOS transistors.

First storage nodes through fourth storage nodes are formed on the substrate having the first through fourth MOS transistors. The first through fourth storage nodes are electrically connected to the first through fourth impurity regions, respectively. Central axes of the first and second storage nodes pass through first positions and second positions that are spaced apart from central points of the first and second impurity regions by predetermined distances toward a negative direction of the x-axis, respectively. In contrast, central axes of the third and fourth storage nodes pass through third positions and fourth positions that are spaced apart from central points of the third and fourth impurity regions by predetermined distances toward a positive direction of the x-axis, respectively.

DRAMs may be fabricated according to other embodiments of the present invention by fabricating in an integrated circuit substrate, a common drain region and first and second source regions, a respective one of which is laterally offset from the common drain region along respective first and second opposite directions. First and second storage nodes are fabricated on the integrated circuit substrate, a respective one of which is electrically connected to a respective one of the first and second source regions. The first and second storage nodes are laterally offset from the respective first and second source regions along the first direction.

In other embodiments, prior to fabricating the source and drain regions, first through fourth gate electrodes are fabricated on the integrated circuit substrate. The source and drain regions are then fabricated by fabricating the common drain region between the first and second gate electrodes, the first source region between the third gate electrode and the first gate electrode, and the second source region between the second gate electrode and fourth gate electrode. The third and fourth gate electrodes are narrower than the first and second gate electrodes adjacent the first and second source regions.

In other embodiments, prior to fabricating the first and second storage nodes, first and second contact plugs are fabricated on the integrated circuit substrate, a respective one of which electrically connects to a respective one of the first and second source regions. The first and second contact plugs are laterally aligned with the respective first and second source regions. In still other embodiments, after fabricating the contact plugs but before fabricating the storage nodes, first and second storage node pads are fabricated on the integrated circuit substrate, a respective one of which is located between a respective one of the first and second contact plugs and a respective one of the first and second storage nodes. The first and second storage node pads are laterally offset from the respective first and second source regions along the first direction.

In still other embodiments of the present invention, a plurality of equally spaced apart alternating rows of first and second active regions are fabricated in an integrated circuit substrate. The second active regions are laterally offset from the first active regions such that a respective second active region is equally spaced apart from two closest first active regions in an adjacent row. First and second source regions are fabricated in each of the first active regions and a first common drain region is fabricated therebetween. A respective one of the first and second source regions is laterally offset from the common drain region along respective first and second opposite directions. Third and fourth source regions are also fabricated in each of the second active regions with a second common drain region therebetween, a respective one of which is laterally offset from the common drain region along respective first and second opposite directions.

An array of first and second storage nodes are fabricated on the integrated circuit substrate, a respective one of which is electrically connected to a respective one of the first and second source regions and laterally offset from the respective first and second source regions along the first direction. Also, an array of third and fourth storage nodes are fabricated on the integrated circuit substrate, a respective one of which is electrically connected to a respective one of the third and fourth source regions, and laterally offset therefrom along the second direction. Gate electrodes, contact plugs and/or storage node pads also may be fabricated, as was described above.

Finally, other methods of fabricating a DRAM according to embodiments of the present invention comprise fabricating an array of memory cell transistors in an integrated circuit substrate, each of which includes a source region. An array of storage nodes is fabricated on the integrated circuit substrate, that are of regular polygonal or circular shape in plan view, a respective one of which is electrically connected to a respective one of the source regions and laterally offset therefrom. Contact plugs and/or storage node pads may be fabricated as was described above.

BRIEF DESCRIPTION OF THE DRAWINGS

FIGS. 2A to 5A are cross-sectional views, taken along the line I-I of FIG. 1, illustrating methods of fabricating DRAMs according to embodiments of the present invention; and FIGS. 2B to 5B are cross-sectional views, taken along the line II-II of FIG. 1, illustrating methods of fabricating DRAMs according to embodiments of the invention.

DETAILED DESCRIPTION

Figure 1:
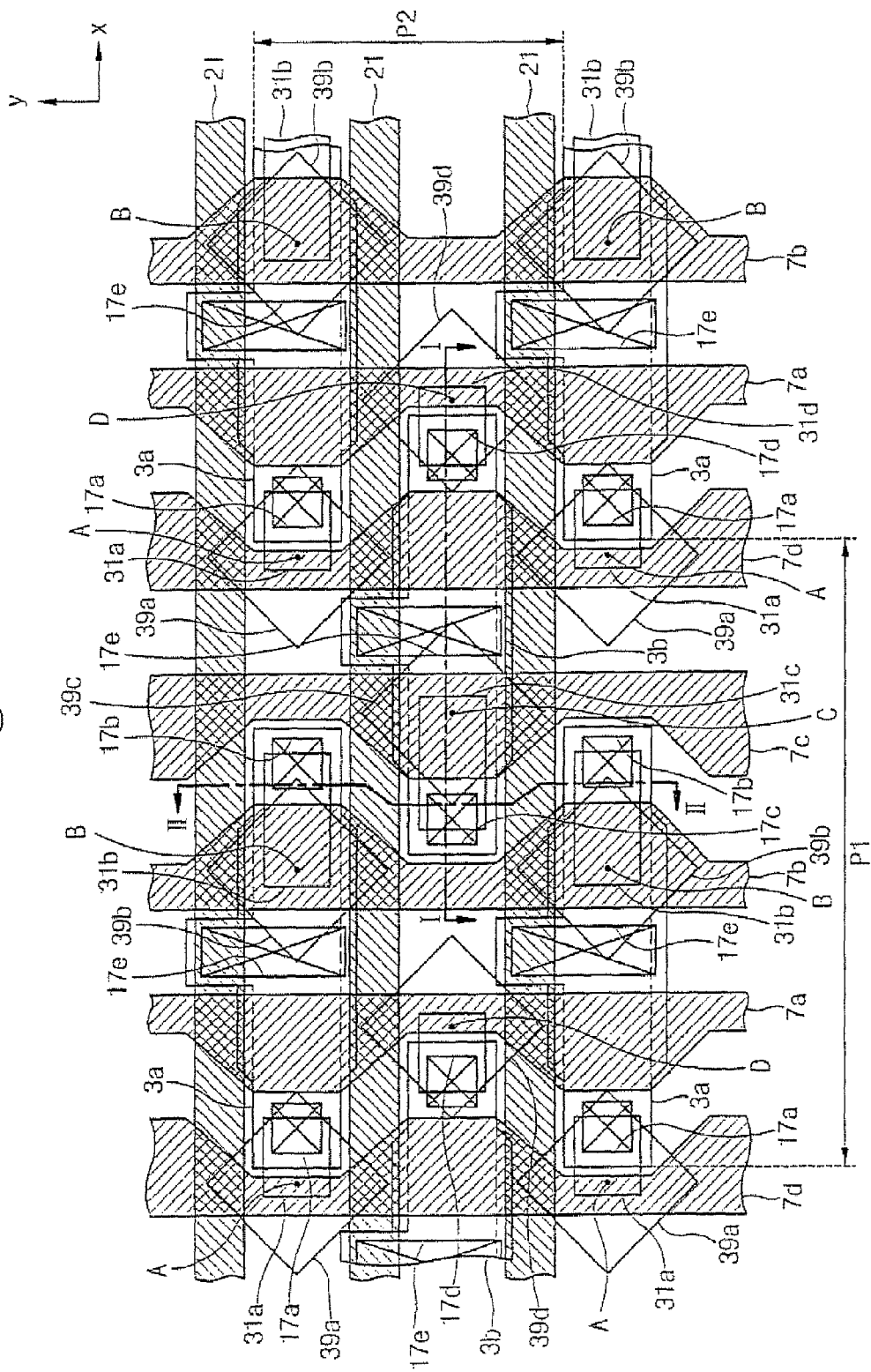
FIG. 1 is a top plan view showing a portion of a DRAM cell array region according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and/or relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

It will be understood that although the terms first, second, third, etc. are used herein to describe various regions, layers and/or sections, these regions, layers and/or sections should not be limited by these terms. These terms are only used to distinguish one region, layer or section from another region, layer or section. Thus, a first region, layer or section discussed below may be termed a second region, layer or section, and similarly, a second region, layer or section may be termed a first region, layer or section without departing from the teachings of the present invention.

It also will be understood that, as used herein the terms "row" and "column" indicate two non-parallel directions that may be orthogonal to one another. However, the terms row and column do not indicate a particular horizontal or vertical orientation.

DRAM cells according to embodiments of the invention will now be described. FIG. 1 is a top plan view showing DRAM cells according to embodiments of the invention and FIGS. 5A and 5B are cross-sectional views taken along the lines I-I and II-II of FIG. 1 respectively.

Figure 5A:
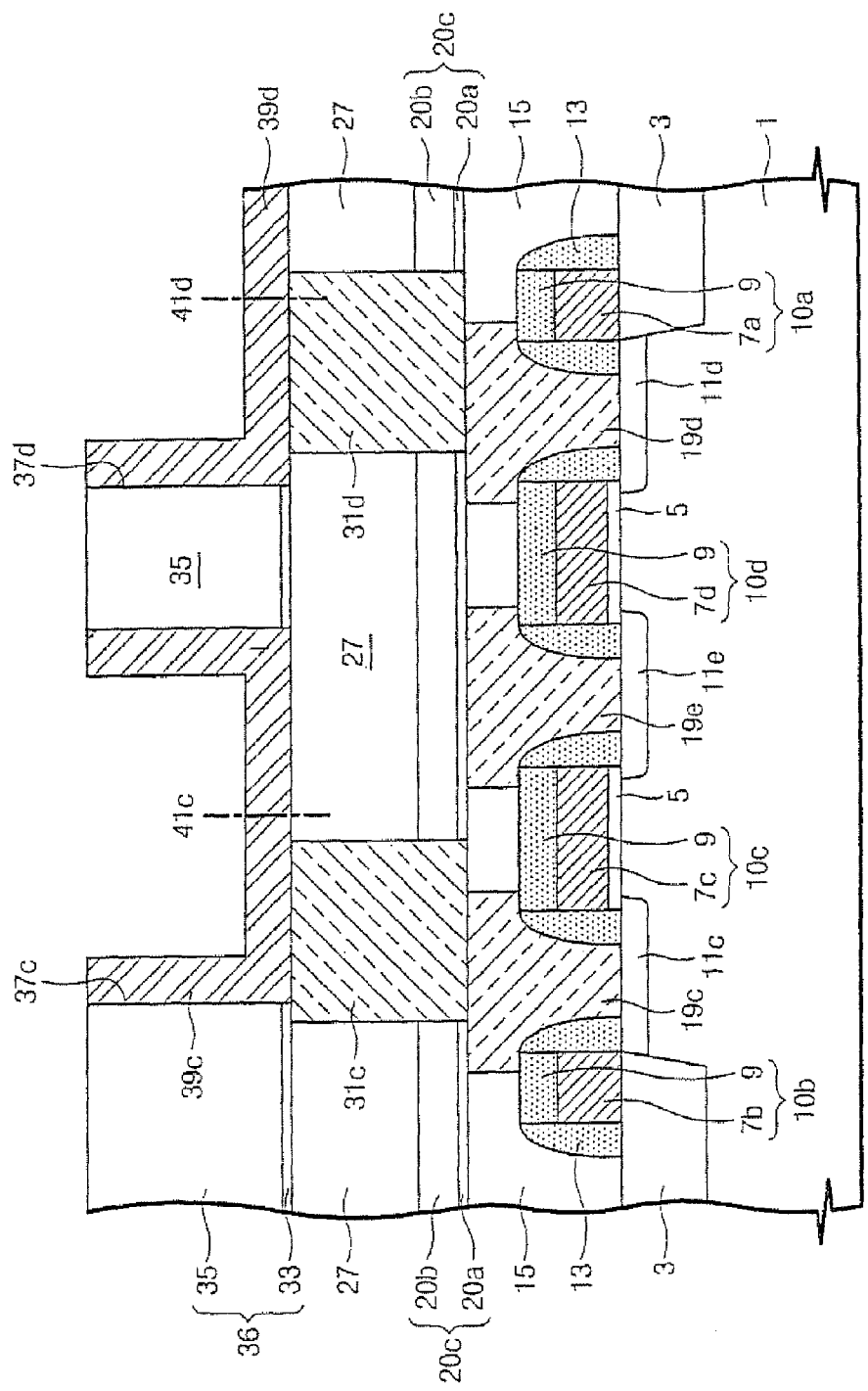
Figure 5B:
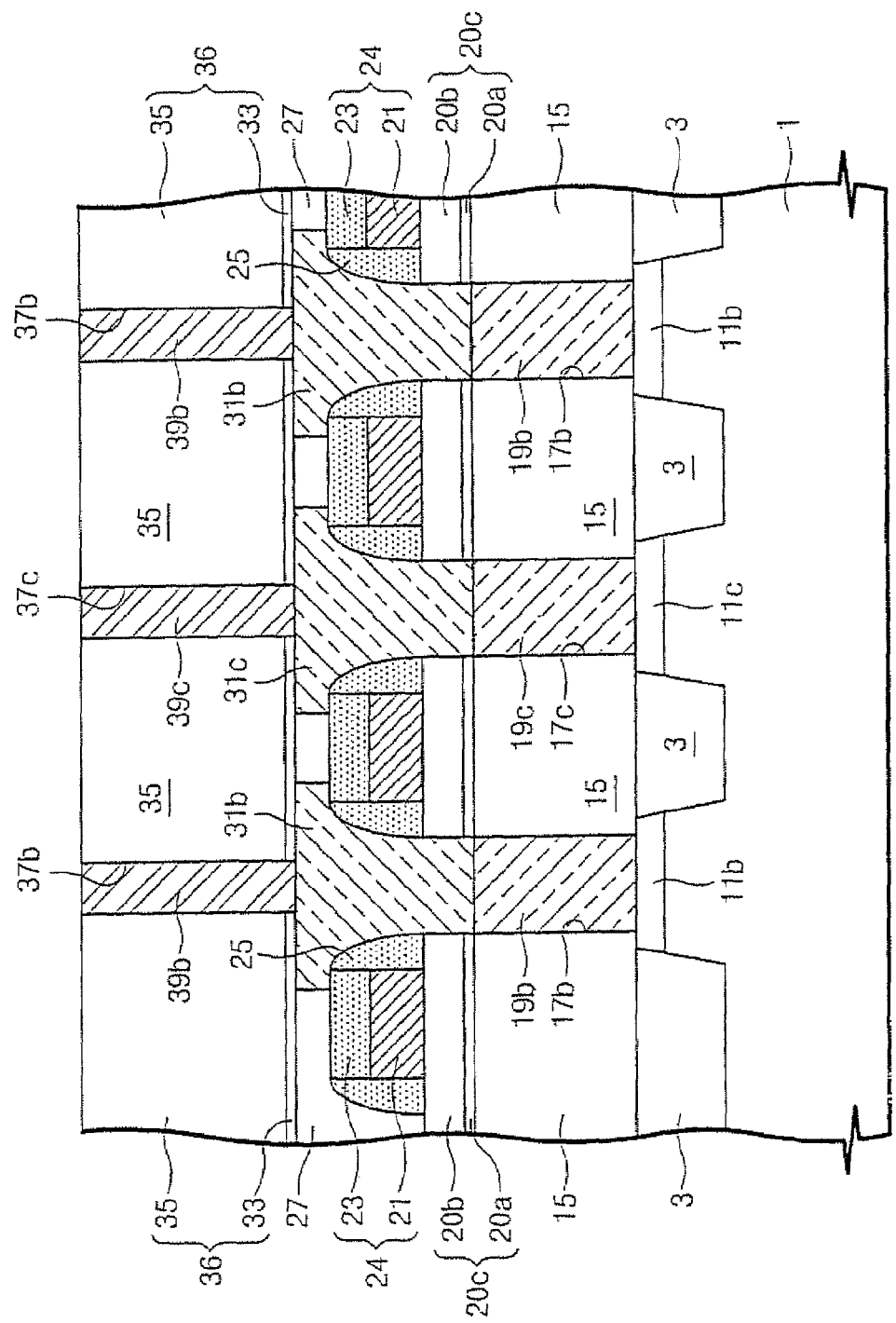

Referring to FIGS. 1, 5A and 5B, an isolation layer 3 is disposed at a predetermined region of an integrated circuit substrate such as a semiconductor substrate 1 to define a plurality of active regions. The active regions include first active regions 3a and second active regions 3b. The first active regions 3a are two dimensionally arrayed along rows (x-axis) and columns (y-axis). The x and y axes denote different directions and need not be orthogonal. The first active regions 3a are arrayed to have a first pitch P1 and a second pitch P2 along the x-axis and the y-axis respectively. The second active regions 3b are located at positions such that the first active regions 3a are parallel-shifted along the x-axis and the y-axis by half the first pitch P1 and half the second pitch P2 respectively.

A first gate electrode 7a and a second gate electrode 7b are disposed across each of the first active regions 3a. Also, a third gate electrode 7c and a fourth gate electrode 7d are disposed across each of the second active regions 3b. The gate electrodes 7a, 7b, 7c and 7d are extended along the y-axis to act as word lines. In some embodiments, capping insulation layer patterns 9 are stacked on the gate electrodes 7a, 7b, 7c and 7d. The first gate electrode 7a and the capping insulation layer pattern 9 thereon constitute a first gate pattern 10a, and the second gate electrode 7b and the capping insulation layer pattern 9 thereon constitute a second gate pattern 10b. Similarly, the third gate electrode 7c and the capping insulation layer pattern 9 thereon constitute a third gate pattern 10c, and the fourth gate electrode 7d and the capping insulation layer pattern 9 thereon constitute a fourth gate pattern 10d. A gate insulation layer 5 is interposed between the active regions and the gate electrodes.

First impurity regions (not shown) are formed at the first active regions 3a that are adjacent to the first gate electrodes 7a and are located opposite the second gate electrodes 7b, and second impurity regions 11b are formed at the first active regions 3a that are adjacent to the second gate electrodes 7b and are located opposite the first gate electrodes 7a. In other words, the first and second impurity regions are formed at opposite ends of each of the first active regions 3a, respectively. The first impurity region acts as a first source region, and the second impurity region 11b acts as a second source region.

Also, third impurity regions 11c are formed at the second active regions 3b that are adjacent to the third gate electrodes 7c and are located opposite the fourth gate electrodes 7d, and fourth impurity regions 11d are formed at the second active regions 3b that are adjacent to the fourth gate electrodes 7d and are located opposite the third gate electrodes 7c. In other words, the third and fourth impurity regions 11c and 11d are formed at opposite ends of each of the second active regions 3b, respectively. The third impurity region 11c acts as a third source region, and the fourth impurity region 11d acts as a fourth source region. In addition, fifth impurity regions 11e are formed at the first active regions 3a between the first and second gate electrode 7a and 7b as well as at the second active regions 3b between the third and fourth gate electrodes 7c and 7d. The fifth impurity regions lie correspond to common drain regions. As a result, a first MOS transistor and a second MOS transistor are formed at each of the first active regions 3a, and a third MOS transistor and a fourth MOS transistor are formed at each of the second active regions 3b.

Accordingly, FIGS. 1, 5A and 5B illustrate a DRAM that includes a common drain region 11e in an integrated circuit substrate 1 and first 11c and second 11d source regions in the integrated circuit substrate, a respective one of which is laterally offset from the common drain region along respective first and second opposite directions (left and right, respectively, in FIGS. 1 and 5A). FIGS. 1, 5A and 5B also illustrate DRAMs according to embodiments of the invention that include a plurality of equally spaced apart alternating rows of first and second active regions 3a, 3b in an integrated circuit substrate 1, the second active regions 3b being laterally offset from the first active regions such that a respective second active region 3b is equally spaced apart from two closest first active regions 3a in an adjacent row. Each of the first active regions 3a comprises first and second source regions and a first common drain region therebetween, a respective one of which is laterally offset from the common drain region along respective first and second opposite directions. Moreover, each of the second active regions comprise third and fourth source regions and a second common drain region therebetween, a respective one of which is laterally offset from the second common drain region along the respective first and second opposite directions.

Continuing with the descriptions of FIGS. 1, 5A and 5B, in some embodiments, widths of the gate electrodes 7a, 7b, 7c and 7d on the active regions 3a and 3b are greater than widths of the gate electrodes 7a, 7b, 7c and 7d on the isolation layer 3, as shown in FIGS. 1 and 5A. This can suppress leakage current of cell transistors, which may be due to short channel effects, by increasing or maximizing the channel lengths of the first through fourth MOS transistors. This also can improve a refresh characteristic of DRAM devices.

In addition, in other embodiments, widths of the first and second active regions 3a and 3b that overlap with the gate electrodes 7a, 7b, 7c and 7d are greater than widths of the first through fourth impurity regions (the source regions). This can enhance current drivability of the first through fourth MOS transistors (the cell transistors) by increasing or maximizing the channel widths of the first through fourth MOS transistors. Particularly, in the event that the isolation layer 3 is formed using a trench isolation technique, small transistors such as the first through fourth MOS transistors may have a low threshold voltage due to an inverse narrow width effect. Thus, it may be difficult to reduce the off current of the MOS transistors. Accordingly, the increase of the channel widths of the first through fourth MOS transistors may lead to an increase of the refresh cycle time and an increase of the sensing margin.

Thus, FIGS. 1, 5A and 5B also illustrate first 10c and second 11d gate electrodes, a respective one of which is on the integrated circuit substrate 1 between the common drain region 11e and the respective one of the first 11c and second 11d source regions, and third 10b and fourth 10a gate electrodes, a respective one of which is on the integrated circuit substrate adjacent a respective one of the first 11c and second 11d source regions and remote from the common drain region 11e, the third 10b and fourth 10a gate electrodes being narrower than the first 10c and second 10d gate electrodes adjacent the first 11c and second 11d source regions.

Sidewalls of the first through fourth gate patterns 10a, 10b, 10c and 10d may be covered with insulation spacers 13. The substrate having the spacers 13 is covered with a first inter-layer insulation layer is. The first through fourth impurity regions are exposed by first through fourth contact holes 17a, 17b, 17c and 17d, respectively, that pass through predetermined regions of the first interlayer insulation layer 5. In addition, the fifth impurity regions lie may be exposed by fifth contact holes 17e. In some embodiments, central axes of the first through fourth contact holes 17a, 17b, 17c and 17d pass through the respective central points of the first through fourth impurity regions. The first through fifth contact holes 17a, 17b, 17c, 17d and 17e are filled with first contact plugs (not shown), second contact plugs 19b, third contact plugs 19c, fourth contact plugs 19d and fifth contact plugs 19e, respectively. The active regions may have protrusions that are extended from their central portions (i.e. common drain regions) toward a positive direction of the y-axis, as shown in FIG. 1. In this case, the fifth contact plugs 19c are extended to cover the protrusions.

Accordingly, FIGS. 1, 5A and 5B illustrate first 19a and second 19b contact plugs on the integrated circuit substrate 1, a respective one of which electrically connects to a respective one of the first 11a and second 11b source regions, the first and second contact plugs being laterally aligned with the respective first and second source regions. Moreover, third 19c and fourth 19d contact plugs also are provided on the integrated circuit substrate 1, a respective one of which electrically connects to a respective one of the third 11c and fourth 11d source regions, the third and fourth contact plugs being laterally aligned with the respective third and fourth source regions.

The substrate having the first through fifth contact plugs is covered with a second interlayer insulation layer 20c. The second interlayer insulation layer 20c may comprise a lower etch stop layer 20a and an insulation layer 20b, which are sequentially stacked. The fifth contact plugs 19e are exposed by bit line contact holes (not shown) that penetrate the second interlayer insulation layer 20c. A plurality of parallel bit lines 21 are disposed on the second interlayer insulation layer 20c. The bit lines 21 are electrically connected to the fifth contact plugs 11e through the bit line contact holes. The bit lines 21 are disposed to be parallel with the x-axis. Also, the bit lines 21 are, in some embodiments, disposed to cross over the isolation layer 3 between the adjacent source regions 11b and 11c along the y-axis as shown in FIG. 5B. In addition, in some embodiments, bit line capping layer patterns 23 are stacked on the bit lines 21. The respective bit lines 21 and the respective bit line capping layer patterns 23 thereon constitute a bit line pattern 24. Sidewalls of the bit line patterns 24 are covered with bit line spacers 25 in some embodiments.

The substrate having the bit line spacers 25 is covered with a third interlayer insulation layer 27. The first through fourth contact plugs are in contact with first through fourth storage node pads 31a, 31b, 31c and 31d that pass through the second and third interlayer insulation layers 20c and 27, respectively. The first and second storage node pads 31a and 31b cover the first and second contact plugs, respectively, and the first and second storage node pads 31a and 31b are extended toward a negative direction of the x-axis. In contrast, the third and fourth storage node pads 31c and 31d cover the third and fourth contact plugs, respectively, and the third and fourth storage node pads 31c and 31d are extended toward a positive direction of the x-axis.

Thus, FIGS. 1, 5A and 5B also illustrate first 31a and second 31b storage node pads on the integrated circuit substrate 1, a respective one of which is located between a respective one of the first 19a and second 19b contact plugs and a respective one of the first 39a and second 39b storage nodes, the first and second storage node pads being laterally offset from the respective first and second source regions along the first direction. FIGS. 1, 5A and 5B also illustrate third 31c and fourth 31d storage node pads on the integrated circuit substrate 1, a respective one of which is located between a respective one of the third 19c and fourth 19d contact plugs and a respective one of the third 39c and fourth 39d storage nodes. The third 31c and fourth 31d storage node pads are laterally offset from the respective third 11c and fourth 11d source regions along the second direction. It will be understood that as used herein, the term laterally offset means laterally offset beyond the amount of offset that is inherent in the systems/processes that are used to fabricate the device, such that a lateral offset is deliberately introduced.

The substrate having the first through fourth storage node pads 31a, 31b, 31c and 31d is covered with a fourth interlayer insulation layer 36. The fourth interlayer insulation layer 36 may comprise an upper etch stop layer 33 and a sacrificial insulation layer 35, which are sequentially stacked. The first through fourth storage node pads 31a, 31b, 31c and 31d are respectively exposed by first storage node contact holes (not shown), second storage node contact holes 31b, third storage node contact holes 31c and fourth storage node contact holes 31d that penetrate the fourth interlayer insulation layer 36. First through fourth storage nodes 39a, 39b, 39c and 39d are disposed in the first through fourth storage node holes.

Central axes of the first storage nodes 39a pass through first points A that are spaced apart from central points of the first contact holes 17a toward a negative direction of the x-axis by a first predetermined distance. Also, central axes of the second storage nodes 39b pass through second points B that are spaced apart from central points of the second contact holes 17b toward a negative direction of the x-axis by a second predetermined distance. The predetermined distances are smaller than a space between the central point of the active region and the central point of the first contact hole 17a (or the central point of the second contact hole 17b) in the active region. In the event that the length of the first active regions 3a is increased in order to increase the channel length of the first and second MOS transistors the first predetermined distance may be different from the second predetermined distance as shown in FIG. 1. It will be understood that as used herein, the term predetermined distance means a predetermined distance beyond the offset distance that is inherent in the systems/processes that are used to fabricate the device, such that the predetermined distance is deliberately introduced.

Accordingly, FIGS. 1, 5A and 5B also illustrate first 39a and second 39b storage nodes on the integrated circuit substrate 1, a respective one of which is electrically connected to a respective one of the first 11a and second 11b source regions, the first and second storage nodes being laterally offset from the respective first and second source regions along the first direction. Moreover, FIGS. 1, 5A and 5B also illustrate third 39c and fourth 39d storage nodes on the integrated circuit substrate, a respective one of which is electrically connected to a respective one of the third 11c and fourth 11d source regions, the third and fourth storage nodes being laterally offset from the respective third and fourth source regions along the second direction.

In some embodiments, the central axis of the first storage node 39a passes through a portion of the isolation layer that is adjacent to the first active region 3a and is located opposite the second MOS transistors, and the central axis of the second storage node 39b passes through the channel region of the second MOS transistors. In more detail, the central axis of the first storage node pad 31a is located between the central axis of the first storage node 39a and the central axis of the first contact hole 17a, and the central axis of the second storage node pad 31b is located between the central axis of the second storage node 39b and the central axis of the second contact hole 17b. The central axes are normal lines that are perpendicular to the x-y plane.

Meanwhile, central axes of the third storage nodes 39c pass through third points C that are spaced apart from central points of the third contact holes 17c toward a positive direction of the x-axis by a third predetermined distance. Also, central axes of the fourth storage nodes 39d pass through fourth points D that are spaced apart from central points of the fourth contact holes 17d toward a positive direction of the x-axis by a fourth predetermined distance. In the event that the length of the second active regions 3b is increased in order to increase the channel length of the third and fourth MOS transistors, the third predetermined distance may be different from the fourth predetermined distance as shown in FIG. 1. In some embodiments, the central axis of the third storage node 39c passes through the channel region of the third MOS transistors, and the central axis of the fourth storage node 39d passes through a portion of the isolation layer that is adjacent to the second active region 3b and is located opposite the third MOS transistors. In more detail, the central axis of the third storage node pad 31c is located between the central axis of the third storage node 39c and the central axis of the third contact hole 17c, and the central axis of the fourth storage node pad 31d is located between the central axis of the fourth storage node 39d and the central axis of the fourth contact hole 17d.

Accordingly, FIGS. 1, 5A and 5B illustrate embodiments of the invention wherein the first 39a and second 39b storage nodes are laterally offset from the respective first 11a and second 11b source regions along the first direction by less than a distance between a central point of the first source region 11a and a central point of the first common drain region, and wherein the third 39c and fourth 39d storage nodes are laterally offset from the respective third 11c and fourth 11d source regions along the second direction by less than a distance between a central point of third 11c source region and a central point of the second common drain region 11e. Moreover, these figures also illustrate embodiments of the present invention, wherein a central point A of the first storage node 39a lies between the first source region 19a and the first common drain region, and a central point 41c of the third storage node 39c lies between the fourth lid source region and the second common drain region.

According to the above descriptions, the distances between the central axes of the adjacent storage nodes may be equal to each other. Thus, it is possible to design storage nodes having a configuration that is similar to a regular polygon shape or a circular shape when viewed from a top plan view. In particular, when the second pitch P2 is a half of the first pitch P1, the top plan view of the storage nodes may have a regular polygon shape or a circular shape. Therefore, these shapes can reduce or prevent the storage nodes from being broken or falling down in a subsequent process. Accordingly, in some embodiments of the present invention, the first through fourth storage nodes exhibit a regular polygonal shape or a circular shape in plan view. Moreover, in some embodiments of the present invention, each of the first through fourth storage nodes is equally spaced apart from its respective four nearest neighbor storage nodes.

Next, fabrication methods of DRAM cells in accordance with embodiments of the present invention will be described with reference to the accompanying drawings.

Figure 2A:
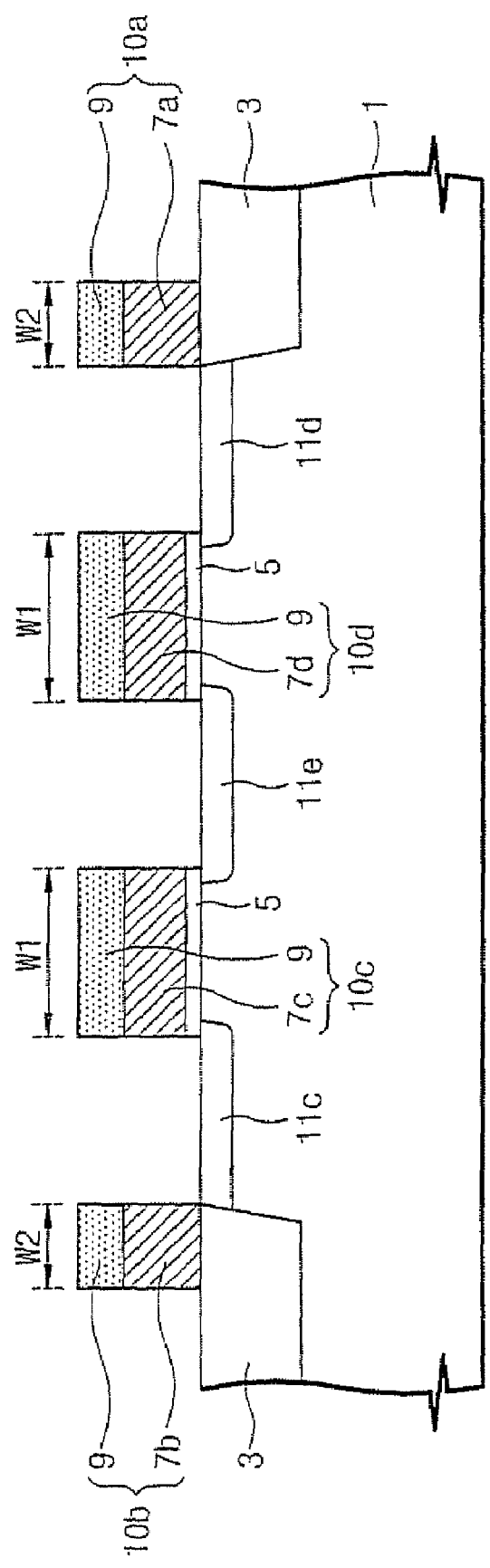
Figure 2B:
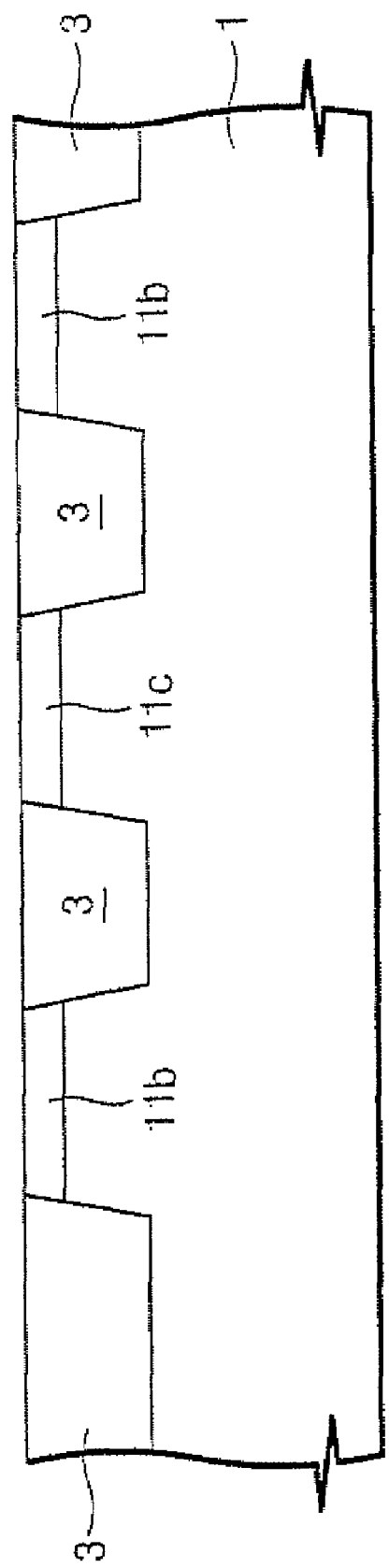

Referring to FIGS. 1, 2A and 2B, an isolation layer 3 is formed at a predetermined region of a semiconductor substrate 1 to define first active regions 3a and second active regions 3b, which are two dimensionally arrayed. The isolation layer 3 can be formed using a conventional trench isolation technique and/or other techniques. The first active regions 3a are defined to have a first pitch P1 and a second pitch P2 along the x-axis and the y-axis respectively, as shown in FIG. 1. Also, the second active regions 3b are defined at positions that the first active regions 3a are parallel-shifted by a half of the first pitch P1 and a half of the second pitch P2 along the x-axis and the y-axis respectively.

Accordingly, FIGS. 1, 2A and 2B illustrate fabricating a plurality of equally spaced apart alternating rows of first 3a and second 3b active regions in an integrated circuit substrate 1, the second active regions 3b being laterally offset from the first active regions 3a such that a respective second active region is equally spaced apart from two closest first active regions in an adjacent row.

A gate insulation layer 5 is formed on the active regions 3a and 3b. A gate conductive layer and a capping insulation layer are sequentially formed on the substrate having the gate insulation layer 5. The capping insulation layer is, in some embodiments, formed of an insulation layer having an etch selectivity with respect to a silicon oxide layer which is used as a conventional interlayer insulation layer. For example, the capping insulation layer may be formed of a silicon nitride layer.

The capping insulation layer and the gate conductive layer are successively patterned to form first through fourth gate patterns 10a, 10b, 10c and 10d that cross over the active regions 3a and 3b. The first and second gate patterns 10a and 10b cross over the first active regions 3a, and the second and fourth gate patterns 10c and 10d cross over the second active regions 3b. Each of the first gate patterns 10a includes a first gate electrode 7a and a capping insulation layer pattern 9 which are sequentially stacked, and each of the second gate patterns 10b includes a second gate electrode 7b and the capping insulation layer pattern 9 which are sequentially stacked. Similarly, each of the third gate patterns 10c includes a third gate electrode 7c and the capping insulation layer pattern 9 which are sequentially stacked and each of the fourth gate patterns 10d includes a fourth gate electrode 7d and the capping insulation layer pattern 9 which are sequentially stacked. In some embodiments, the capping insulation layer and the gate conductive layer are patterned so that the width W1 of the gate electrodes that overlap with the active regions is wider than the width W2 of the gate electrodes that overlap with the isolation layer 3.

Impurity ions are implanted into the active regions using the gate patterns 10a, 10b, 10c and 10d as ion implantation masks, thereby forming first impurity regions (not shown), second impurity regions 11b, third impurity regions 11c, fourth impurity regions 11d and fifth impurity regions 11e. The first and second impurity regions are formed at both ends of the first active regions 3a, and the third and fourth impurity regions 11c and 11d are formed at both ends of the second active regions 3b. Also, the fifth impurity regions 11e are formed at the first active regions 3a between the first and second gate electrodes 7a and 7b as well as the second active regions 3b between the third and fourth gate electrodes 7c and 7d. Accordingly, a first MOS transistor and a second MOS transistor are formed at each of the first active regions 3a, and a third MOS transistor and a fourth MOS transistor are formed at each of the second active regions 3b.

Accordingly, these figures illustrate fabricating first and second source regions in each of the first active regions and a first common drain region therebetween, a respective one of which is laterally offset from the common drain along respective first and second opposite directions. These figures also illustrate fabricating third and fourth source regions in each of the second active regions and a second common drain region therebetween, a respective one of which is laterally offset from the common drain region along the respective first and second opposite directions.

The first impurity regions act as source regions of the first MOS transistors, and the second impurity regions 11b act as source regions of the second MOS transistors. Also, the third impurity regions 11c act as source regions of the third MOS transistors, and the fourth impurity regions 11d act as source regions of the fourth MOS transistors. In addition, the fifth impurity regions 11e in the first active regions 3a act as common drain regions of the first and second MOS transistors, and the fifth impurity regions 11e in the second active regions 3b act as common drain regions of the third and fourth MOS transistors. Insulating spacers 13 are then formed on sidewalls of the gate patterns 10a, 10b, 10c and 10d using a conventional manner. The insulating spacers 13 are formed of the same material layer as the capping insulation layer.

Figure 3A:
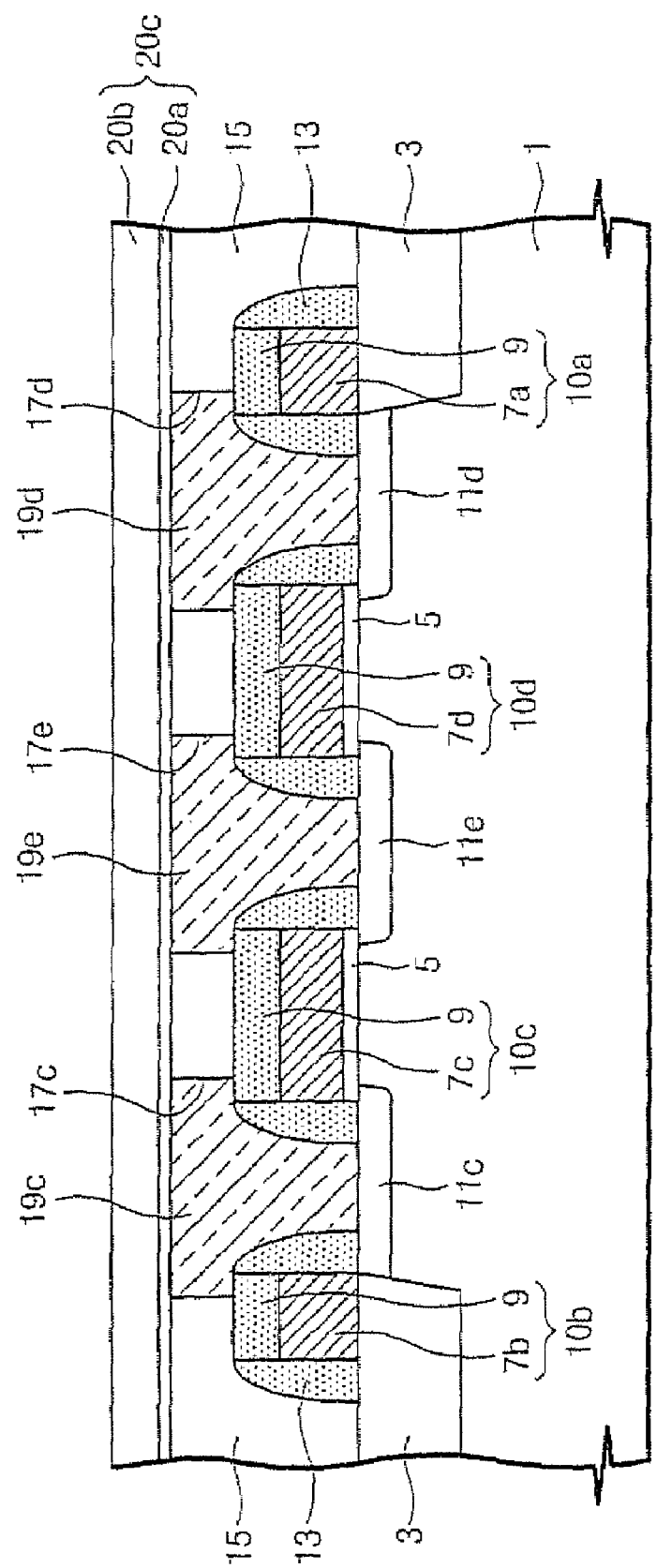
Figure 3B:
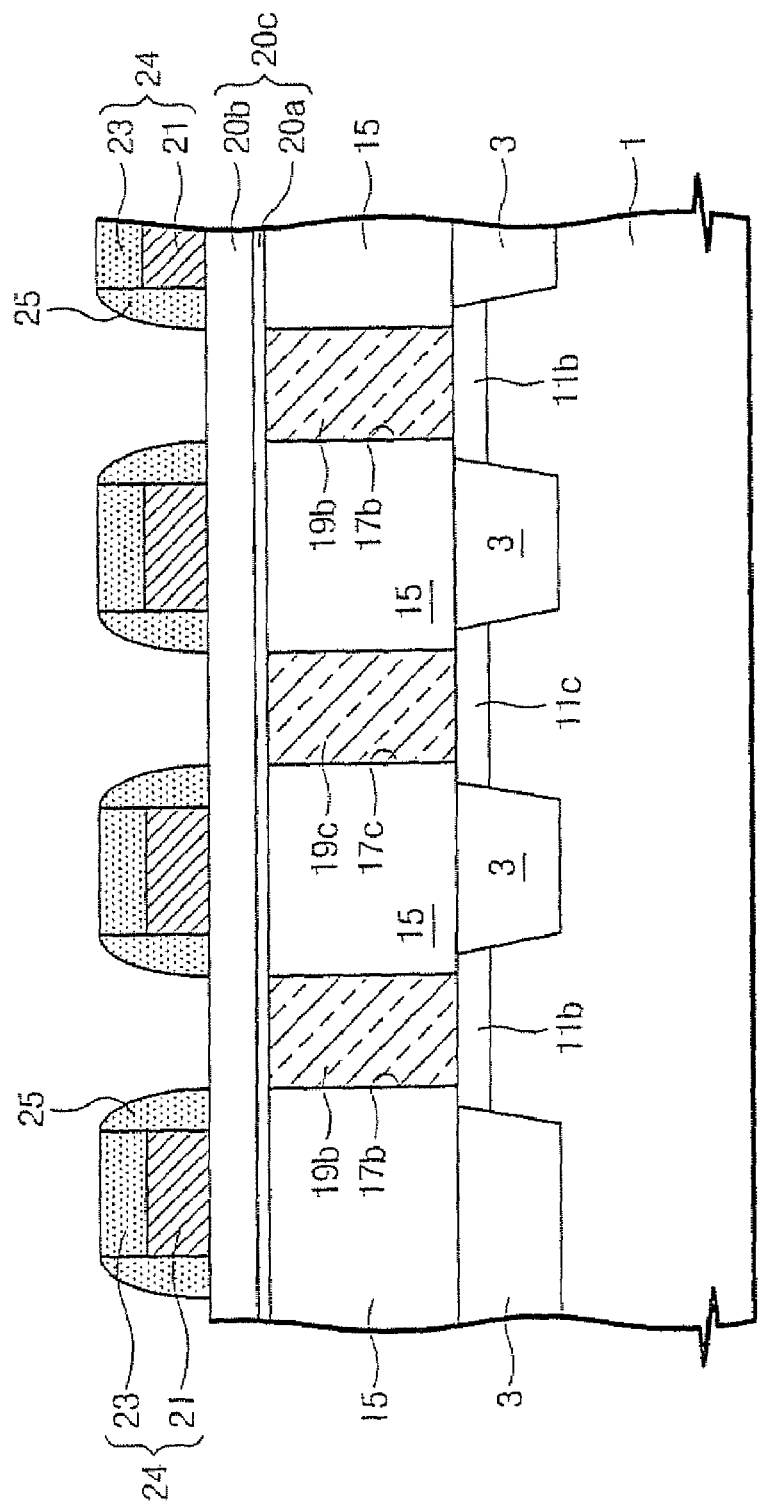

Referring to FIGS. 1, 3A and 3B, a first interlayer insulation layer 15 is formed on the substrate having the spacers 13. The first interlayer insulation layer 15 is patterned to form first through fifth contact holes 17a, 17b, 17c, 17d and 17e that expose the first through fifth impurity regions, respectively. The capping insulation layer patterns 9 and the spacers 13 act as etch stop layers during formation of the first through fifth contact holes 17a, 17b, 17c, 17d and 17e. In other words, the first through fifth contact holes 17a, 17b, 17c, 17d and 17e may be formed using a self-aligned contact technique. First contact plugs (not shown), second contact plugs 19b, third contact plugs 19c, fourth contact plugs 19d and fifth contact plugs 19e are formed using a conventional manner in the first through fifth contact holes 17a, 17b, 17c, 17d and 17e, respectively.

A second interlayer insulation layer 20c is formed on the substrate having the first through fifth contact plugs. The second interlayer insulation layer 20c is formed, in some embodiments, by sequentially stacking a lower etch stop layer 20a and an insulation layer 20b. The lower etch stop layer 20a is formed of an insulation layer that has an etch selectivity with respect to the insulation layer 20b, the first interlayer insulation layer 15 and the contact plugs. For example, the lower etch stop layer 20c may be formed of a silicon nitride layer. The second interlayer insulation layer 20c is patterned to form bit line contact holes that expose the fifth contact plugs 19e.

A plurality of parallel bit line patterns 24 covering the bit line contact holes are formed on the second interlayer insulation layer 20c. Each of the bit line patterns 24 comprises a bit line 21 and a bit line capping layer pattern 23 which are sequentially stacked. The bit lines 21 are electrically connected to the fifth contact plugs 19e through the bit line contact holes. Also, the bit line patterns 24 are formed to cross over the gate electrodes 7a, 7b, 7c and 7d. Bit line spacers 25 are formed on sidewalls of the bit line patterns 24 using a conventional method. The bit line capping layer patterns 23 and the bit line spacers 25 are formed, in some embodiments, of the same material layer as the gate capping layer patterns 9 and the gate spacers 13.

Figure 4A:
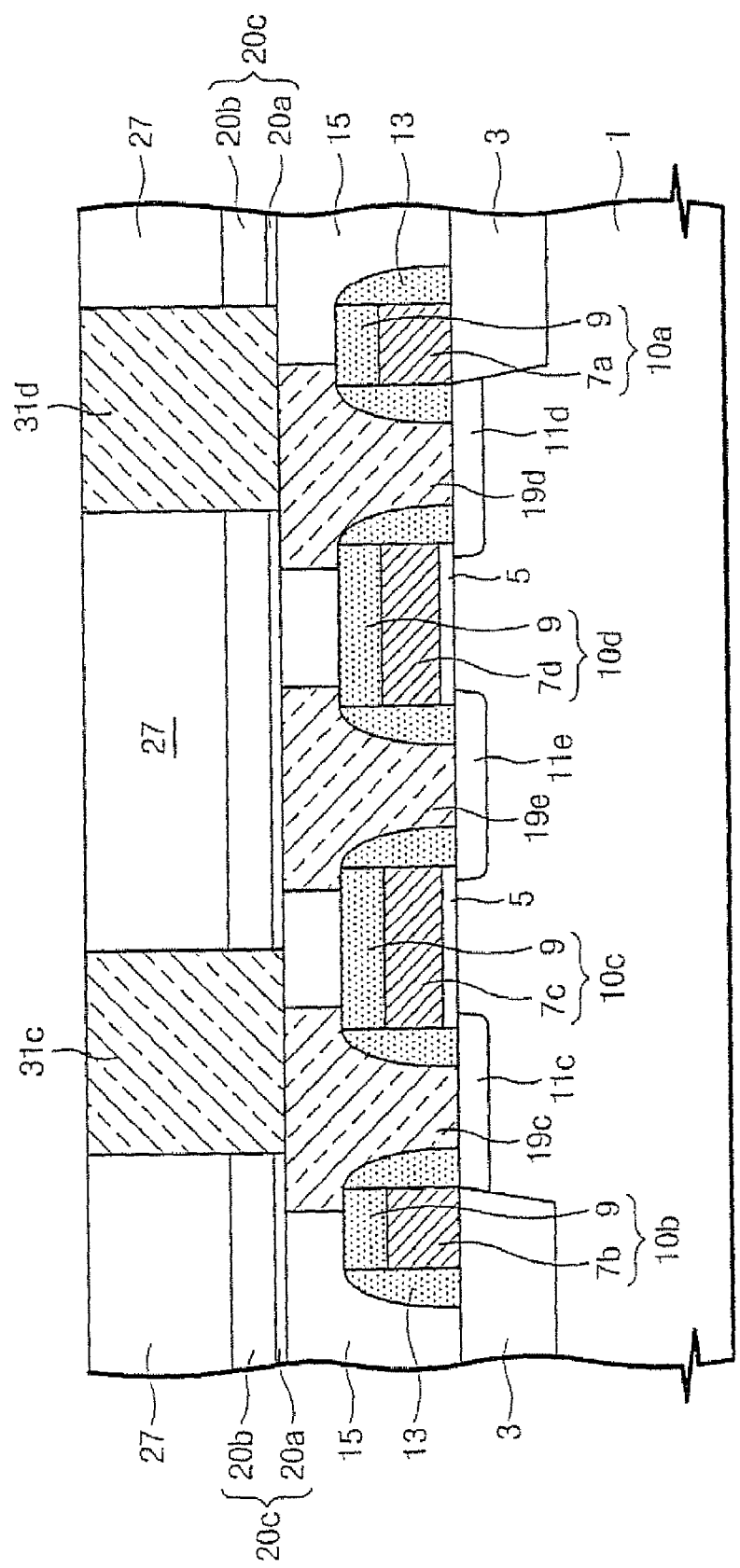
Figure 4B:
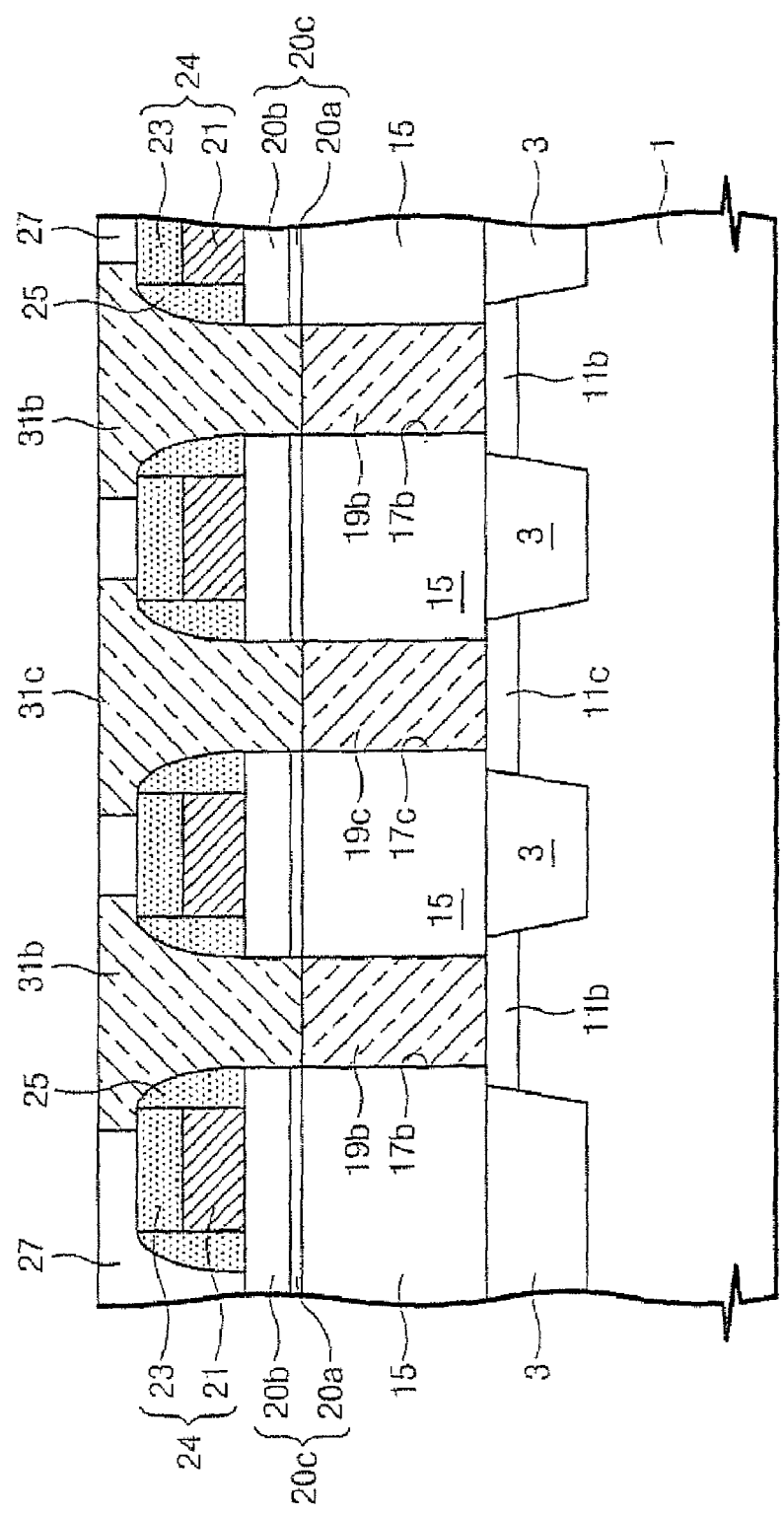

Referring to FIGS. 1, 4A and 4B, a third interlayer insulation layer 27 is formed on the substrate including the bit line spacers 25. The third interlayer insulation layer 27 and the insulation layer 20b are successively patterned to form first through fourth preliminary storage node pad contact holes on the first through fourth contact plugs, respectively. The first and second preliminary storage node pad contact holes are formed to have central axes that are respectively shifted from the central axes of the first and second impurity regions toward a negative direction of the x-axis. Thus, the first preliminary storage node pad contact holes may expose the lower etch stop layer 20a on the fourth gate electrodes 7d, and the second preliminary storage node pad contact holes may expose the lower etch stop layer 20a on the second gate electrodes 7b.

In contrast, the third and fourth preliminary storage node pad contact holes are formed to have central axes that are respectively shifted from the central axes of the third and fourth impurity regions toward a positive direction of the x-axis. Accordingly, the third preliminary storage node pad contact holes may expose the lower etch stop layer 20a on the third gate electrodes 7c, and the fourth preliminary storage node pad contact holes may expose the lower etch stop layer 20a on the first gate electrodes 7a.

Subsequently, the lower etch stop layer 20a exposed by the first through fourth preliminary storage node pad contact holes is selectively etched to form first through fourth storage node pad contact holes that expose the first through fourth contact plugs, respectively. First through fourth storage node pads 31a, 31b, 31c and 31d are formed in the first through fourth storage node pad contact holes, respectively.

Referring to FIGS. 1, 5A and 5B, a fourth interlayer insulation layer 36 is formed on the substrate having the first through fourth storage node pads 31a, 31b, 31c and 31d. The fourth interlayer insulation layer 36 is, in some embodiments, formed by sequentially stacking an upper etch stop layer 33 and a sacrificial insulation layer 35. The upper etch stop layer 33 is, in some embodiments, formed of an insulation layer that has an etch selectivity with respect to the sacrificial insulation layer 35, the storage node pads 31a, 31b, 31c and 31d, and the third interlayer insulation layer 27. For example, the upper etch stop layer 33 may be formed of a silicon nitride layer. In contrast, the sacrificial insulation layer 35 is preferably formed of a silicon oxide layer.

The sacrificial insulation layer 35 and the upper etch stop layer 33 are successively patterned to form first storage node contact holes, second storage node contact holes 37b, third storage node contact holes 37c and fourth storage node contact holes 37d that expose the first through fourth storage node pads 31a, 31b, 31c and 31d, respectively, The first and second storage node contact holes are formed to have first and second central axes passing through first positions A and second positions B that are shifted from the central axes of the first and second storage node pads 31a and 31b toward a negative direction of the x-axis, respectively. In contrast, the third and fourth storage node contact holes are formed to have third and fourth central axes 41c and 41d passing through third positions C and fourth positions D that are shifted from the central axes of the third and fourth storage node pads 31c and 31d toward a positive direction of the x-axis, respectively. In more detail, the first central axis may pass through a portion of the isolation layer 3 that is adjacent to the first impurity region and is located opposite the second MOS transistor, and the second central axis may pass through the channel region of the second MOS transistor. Also, the third central axis 41c may pass through the channel region of the third MOS transistor, and the fourth central axis may pass through a portion of the isolation layer 3 that is adjacent to the fourth impurity region 11d and is located opposite the third MOS transistor.

First through fourth storage nodes 39a, 39b, 39c and 39d are formed in the first through fourth storage node contact holes. The storage nodes 39a, 39b, 39c and 39d may exhibit a cylinder-shaped perspective view or a box-shaped perspective view. Also, the storage nodes 39a, 39b, 39c and 39d may be arrayed so that the distances between the central axes of the adjacent storage nodes 39a, 39b, 39c and 39d are equal to each other. If the second pitch P2 is a half of the first pitch P1, the storage nodes 39a, 39b, 39c and 39d may be formed to have a regular polygon shape or a circular shape when viewed from a top plan view. The sacrificial insulation layer 35 may be then selectively removed to expose outer sidewalls of the storage nodes 39a, 39b, 39c and 39d.

Accordingly, these figures illustrate fabricating first and second storage nodes on the integrated circuit substrate, a respective one of which is electrically connected to a respective one of the first and second source regions. The first and second storage nodes are laterally offset from the respective first and second source regions along the first direction. These figures also illustrate forming third and fourth storage nodes on the integrated circuit substrate, a respective one of which is electrically corrected to a respective one of the third and fourth source regions. The third and fourth storage nodes are laterally offset from the respective third and fourth source regions along the second direction.

According to some embodiments of the invention, it is possible to reduce or minimize the difference between the length and width of the storage nodes and to allow reduced channel leakage currents of the cell transistors. Thus, it is possible to remarkably improve the refresh characteristic of DRAM device and/or the yield thereof.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a Dynamic Random Access Memory (DRAM) comprising:
   fabricating in an integrated circuit substrate, a common drain region and first and second source regions, a respective one of which is laterally offset from the common drain region along respective first and second opposite directions; and
   fabricating first and second storage nodes on the integrated circuit substrate, a respective one of which is electrically connected to a respective one of the first and second source regions, the first and second storage nodes being laterally offset from the respective first and second source regions along the first direction.

2. A method according to claim 1 wherein the fabricating a common drain region and first and second source regions is preceded by fabricating first through fourth gate electrodes on the integrated circuit substrate, wherein the fabricating a common drain region and first and second source regions comprises fabricating the common drain region between the first and second gate electrodes, the first source region between the third gate electrode and the first gate electrode and the second source region between the second gate electrode and the fourth gate electrode, and wherein the third and fourth gate electrodes are narrower than the first and second gate electrodes adjacent the first and second source regions.

3. A method according to claim 1 wherein the following is performed between the fabricating a common drain region and first and second source regions and the fabricating first and second storage nodes:
   fabricating first and second contact plugs on the integrated circuit substrate, a respective one of which electrically connects to a respective one of the first and second source regions, the first and second contact plugs being laterally aligned with the respective first and second source regions.

4. A method according to claim 3 wherein the following is performed between the fabricating first and second contact plugs and the fabricating first and second storage nodes:
   fabricating first and second storage node pads on the integrated circuit substrate, a respective one of which is located between a respective one of the first and second contact plugs and a respective one of the first and second storage nodes, the first and second storage node pads being laterally offset from the respective first and second source regions along the first direction.

5. A method according to claim 4 wherein the first and second storage nodes are laterally offset from the respective first and second storage node pads along the first direction.

6. A method according to claim 1 wherein the first and second storage nodes are laterally offset from the respective first and second source regions along the first direction by less than a distance between a central point of the first source region and a central point of the common drain region.

7. A method according to claim 1 wherein a central point of the first storage node lies between the first source region and the common drain region.

8. A method according to claim 1 wherein the first and second storage nodes exhibit a regular polygon shape or a circular shape in plan view.

9. A method of fabricating a Dynamic Random Access Memory (DRAM) comprising:
   fabricating a plurality of equally spaced apart alternating rows of first and second active regions in an integrated circuit substrate, the second active regions being laterally offset from the first active regions such that a respective second active region is equally spaced apart from two closest first active regions in an adjacent row;
   fabricating first and second source regions in each of the first active regions and a first common drain region therebetween, a respective one of which is laterally offset from the common drain region along respective first and second opposite directions, and third and fourth source regions in each of the second active regions and a second common drain region therebetween, a respective one of which is laterally offset from the common drain region along the respective first and second opposite directions; and
   fabricating an array of first and second storage nodes on the integrated circuit substrate, a respective one of the first and second storage nodes being electrically connected to a respective one of the first and second source regions, the respective first and second storage nodes being laterally offset from the respective first and second source regions along the first direction, and an array of third and fourth storage nodes on the integrated circuit substrate, a respective one of the third and fourth storage nodes being electrically connected to a respective one of the third and fourth source regions, the respective third and fourth storage nodes being laterally offset from the respective third and fourth source regions along the second direction.

10. A method according to claim 9 wherein the fabricating first and second source regions is preceded by fabricating an array of first through fourth gate electrodes on the integrated circuit substrate, wherein the respective third and fourth gate electrodes are narrower than the respective first and second gate electrodes adjacent the respective first and second source regions, and wherein the fabricating first and second source regions comprises fabricating the first common drain region between the first and second gate electrodes, the first source region between the third gate electrode and the first gate electrode and the second source region between the fourth gate electrode and the second gate electrode.

11. A method according to claim 9 wherein the following is performed between the fabricating first and second source regions and the fabricating first and second storage nodes:

fabricating an array of first and second contact plugs on the integrated circuit substrate, a respective one of which electrically connects to a respective one of the first and second source regions, the respective first and second contact plugs being laterally aligned with the respective first and second source regions, and an array of third and fourth contact plugs on the integrated circuit substrate, a respective one of which electrically connects to a respective one of the third and fourth source regions, the respective third and fourth contact plugs being laterally aligned with the respective third and fourth source regions.

12. A method according to claim 11 wherein the following is preformed between the fabricating an array of first and second contact plugs and the fabricating an array of first and second storage nodes:

fabricating an array of first and second storage node pads on the integrated circuit substrate, a respective one of which is located between a respective one of the first and second contact plugs and a respective one of the first and second storage nodes, the respective first and second storage node pads being laterally offset from the respective first and second source re-ions along the first direction, and an array of third and fourth storage node pads on the integrated circuit substrate, a respective one of which is located between a respective one of the third and fourth contact plugs and a respective one of the third and fourth storage nodes, the respective third and fourth storage node pads being laterally offset from the respective third and fourth source regions along the second direction.

13. A method according to claim 12 wherein the respective first and second storage nodes are laterally offset from the respective first and second storage node pads along the first direction and wherein the respective third and fourth storage nodes are laterally offset from the respective third and fourth storage node pads along the second direction.

14. A method according to claim 13 wherein the respective first and second storage nodes are laterally offset from the respective first and second source regions along the first direction by less than a distance between a central point of a first source region and a central point of a first common drain region and wherein the respective third and fourth storage nodes are laterally offset from the respective third and fourth source regions along the second direction by less than a distance between a central point of a third source region and a central point of a second common drain region.

15. A method according to claim 9 wherein a central point of a respective first storage node lies between a respective first source region and a respective first common drain region and wherein a central point of a respective third storage node lies between a respective fourth source region and a respective second common drain region.

16. A DRAM according to claim 9 wherein the first through fourth storage nodes exhibit a regular polygon shape or a circular shape in plan view.

17. A DRAM according to claim 9 wherein each of the first through fourth storage nodes is equally spaced apart from its respective four nearest neighbor storage nodes.

18. A method of fabricating a Dynamic Random Access Memory (DRAM) comprising:

fabricating an array of memory cell transistors in an integrated circuit substrate, each of which comprises a source region; and fabricating an array of storage nodes on the integrated circuit substrate that are of regular polygon or circular shape in plan view, a respective one of which is electrically connected to a respective one of the source regions and laterally offset therefrom.

19. A method according to claim 18 wherein the fabricating an array of storage nodes comprises fabricating an array of equally spaced apart storage nodes on the integrated circuit substrate.

20. A method according to claim 18 wherein the following is performed between the fabricating an array of memory cell transistors and the fabricating an array of equally spaced apart storage nodes:

fabricating an array of contact plugs on the integrated circuit substrate, a respective one of which electrically connects to a respective one of the source regions, the respective contact plugs being laterally aligned with the respective source regions.

21. A method according to claim 20 further wherein the following is performed between the fabricating an array of contact plugs and the fabricating an array of equally spaced apart storage nodes:

fabricating an array of storage node pads on the integrated circuit substrate, a respective one of which is located between a respective one of the contact plugs and a respective one of the storage nodes, the respective storage node pads being laterally offset from the respective source regions.

22. A method according to claim 21 wherein the respective storage nodes are laterally offset from the respective storage node pads.

* * * * *

UNITED STATES PATENT AND TRADEMARK OFFICE
CERTIFICATE OF CORRECTION

PATENT NO.        : 7,504,295 B2
APPLICATION NO.   : 11/470011
DATED             : March 17, 2009
INVENTOR(S)       : Lee et al.

Page 1 of 1

It is certified that error appears in the above-identified patent and that said Letters Patent is hereby corrected as shown below:

In the Claims:

Column 19, Claim 12, Line 26: Please correct "re-ions" to read -- regions --

Signed and Sealed this

Nineteenth Day of May, 2009

JOHN DOLL
*Acting Director of the United States Patent and Trademark Office*